(12) United States Patent
Castillo et al.

(10) Patent No.: US 8,592,258 B2
(45) Date of Patent: Nov. 26, 2013

(54) SEMICONDUCTOR PACKAGE AND METHOD OF ATTACHING SEMICONDUCTOR DIES TO SUBSTRATES

(75) Inventors: Denver Paul C. Castillo, Singapore (SG); Bryan Soon Hua Tan, Singapore (SG); Rodel Manalac, Singapore (SG); Kian Teng Eng, Singapore (SG); Pang Hup Ong, Singapore (SG); Soo Pin Chow, Singapore (SG); Wolfgang Johannes Hetzel, Nattheim (DE); Werner Josef Reiss, Bad Feilnbach (DE); Florian Ammer, Ergoldsbach (DE)

(73) Assignees: United Test and Assembly Center, Ltd., Singapore (SG); QIMONDA AG (DE)

( * ) Notice: Subject to any disclaimer, the term of this patent is extended or adjusted under 35 U.S.C. 154(b) by 126 days.

(21) Appl. No.: 13/278,152

(22) Filed: Oct. 20, 2011

(65) Prior Publication Data

US 2012/0034738 A1 Feb. 9, 2012

Related U.S. Application Data

(62) Division of application No. 12/344,023, filed on Dec. 24, 2008, now abandoned.

(60) Provisional application No. 61/016,863, filed on Dec. 27, 2007.

(51) Int. Cl.
*H01L 21/00* (2006.01)

(52) U.S. Cl.
USPC .... 438/118; 438/455; 438/942; 257/E21.505; 257/E21.499; 257/E21.037

(58) Field of Classification Search
USPC ........................ 438/107–109, 118, 455, 942; 257/E21.505, E21.499, E21.037
See application file for complete search history.

(56) References Cited

U.S. PATENT DOCUMENTS

| | | | |
|---|---|---|---|
| 6,525,407 B1 * | 2/2003 | Drewery | 257/666 |
| 2003/0207499 A1 * | 11/2003 | DiStefano et al. | 438/125 |
| 2003/0218258 A1 | 11/2003 | Charles et al. | |
| 2004/0195699 A1 | 10/2004 | Massingill | |
| 2007/0190691 A1 * | 8/2007 | Humpston et al. | 438/113 |
| 2008/0224298 A1 | 9/2008 | Corisis et al. | |

FOREIGN PATENT DOCUMENTS

| | | |
|---|---|---|
| TW | 518732 B | 1/2003 |
| TW | 200722471 A | 6/2007 |
| TW | 200727446 A | 7/2007 |

* cited by examiner

*Primary Examiner* — Michelle Mandala
(74) *Attorney, Agent, or Firm* — Horizon IP Pte. Ltd.

(57) ABSTRACT

A method of mounting a semiconductor die on a substrate with a solder mask on a first surface includes placing a die on the solder mask, and mounting the die to the substrate by applying pressure and heat. The applied pressure ranges from a bond force of approximately 5 to 10 kgf, the heat has a temperature range from approximately 150 to 200° C. and the pressure is applied for a range of approximately 1 to 10 seconds.

20 Claims, 8 Drawing Sheets

| Characteristics | Unit | Conditioning | Typical Values | Specs |
|---|---|---|---|---|
| Thermal Stress | SEC | 288°C solder dipping | 90^ | 10^ |
| Coefficient of Thermal Expansion | | | | |
| Z-axis before Tg | in/in/°C | TMA | $5 \times 10^{\wedge}-5$ | N/A |
| Z-axis after Tg | in/in/°C | TMA | $25 \times 10^{\wedge}-5$ | |

Note: TMA means ThermoMechanical Analysis

Figure 2

| LEG | Pattern | MACHINE PARAMETER | | | | OUTPUT VARIABLE RESPONSE | | REMARKS |
|---|---|---|---|---|---|---|---|---|
| | | Bond Temp (°C) | Bond Time (sec) | Bond Force (kgf) | | Die Shear(kgf, AVE) | Die Drop / Peel-off (YES/NO) | |
| 1 | - - - | 100 | 2 | 2 | | N/A | YES (@ Time Zero) | FAILED |
| 2 | - - + | 100 | 2 | 10 | | N/A | YES (@ Time Zero) | FAILED |
| 3 | - + - | 100 | 10 | 2 | | N/A | YES (@ Time Zero) | FAILED |
| 4 | - + + | 100 | 10 | 10 | | N/A | YES (@ Time Zero) | FAILED |
| 5 | + - - | 200 | 2 | 2 | | N/A | YES (@ Time Zero) | FAILED |
| 6 | + - + | 200 | 2 | 10 | | N/A | YES (@ Time Zero) | FAILED |
| 7A | + + - | 200 | 10 | 2 | | 15.64 | YES (3/90 Die Dropped during Wire Bond; 4/87 Die Dropped before Mold; 26/83 Die Peeled-Off after MOLD) | FAILED, Refer to Attachment C |
| 7B | | | | | | 15.21 | YES (36/90 Die Peeled-Off after MOLD) | |
| 8A | + + + | 200 | 10 | 10 | | 15.89 | NO (0/90 units) | PASSED, Refer to Attachment D |
| 8B | | | | | | 15.73 | NO (0/90 units) | |

Figure 4A

| LEG | Pattern | MACHINE PARAMETER ||||OUTPUT VARIABLE RESPONSE |||REMARKS |
|---|---|---|---|---|---|---|---|---|
| | | Bond Temp (°C) | Bond Time (sec) | Bond Force (kgf) | | Die Shear (kgf, AVE) | Die Drop / Peel-off (YES/NO) | |
| 1 | - - - | 150 | 1 | 1 | | N/A | YES (47/90 units) | FAILED |
| 2 | - - + | 150 | 5 | 10 | | 6.59 | NO (0/90 units) | Too High Bond Force |
| 3 | - + * | 150 | 10 | 5 | | 5.51 | NO (0/90 units) | UPH constraint |
| 4 | * - + | 175 | 1 | 10 | | 6.45 | NO (0/90 units) | Too High Bond Force |
| 5 | * * * | 175 | 5 | 5 | | 10.13 | NO (0/90 units) | PASSED |
| 6 | * + - | 175 | 10 | 1 | | 5.17 | NO (0/90 units) | Low Die Shear |
| 7 | + - * | 200 | 1 | 5 | | 8.91 | NO (0/90 units) | Die Max Temp Capability |
| 8 | + * - | 200 | 5 | 1 | | 4.33 | NO (0/90 units) | Low Die Shear |
| 9 | + + + | 200 | 10 | 10 | | 12.25 | NO (0/90 units) | Die Max Temp Capability |

| | | Parameter Setting | | | | | |
|---|---|---|---|---|---|---|---|
| Substrate Condition | Bare Substrate | Substrate with Soldermask (without oven baking) | | | Substrate with Soldermask (with oven baking) | | |
| Bond Temp | 100 - 475°C | 200°C | | | 200°C | | |
| Bond Force | 1 kgf - 10 kgf | 10 kgf | | | 10 kgf | | |
| Bond Time | 1-10secs | 10secs | | | 10secs | | |
| | | Die Shear Specs: 2.5kgf min | | Drop/Peel-Off Die / Die Crack | Die Shear Specs: 2.5kgf min | | Drop/Peel-Off Die / Die Crack |
| sample | | at Time 0 | After 24hrs Staging | | at Time 0 | After 24hrs Staging | |
| 1 | | 16.30 | 15.30 | N | 9.55 | 2.75 | N |
| 2 | | 15.45 | 15.90 | N | 8.65 | 0.00 | Y |
| 3 | | 15.60 | 15.50 | N | 7.75 | 0.00 | Y |
| 4 | | 15.50 | 15.15 | N | 8.90 | 0.00 | Y |
| 5 | | 15.50 | 16.00 | N | 8.45 | 8.15 | N |
| 6 | | 15.65 | 15.15 | N | 8.15 | 0.65 | Y |
| 7 | | 15.50 | 15.15 | N | 7.60 | 2.75 | N |
| 8 | | 15.20 | 15.90 | N | 7.75 | 0.50 | Y |
| 9 | | 16.90 | 17.10 | N | 8.50 | 0.00 | Y |
| 10 | | 15.75 | 15.55 | N | 7.70 | 0.00 | Y |
| 11 | | 15.00 | 15.10 | N | 7.85 | 0.00 | Y |
| 12 | | 17.40 | 15.25 | N | 9.10 | 0.00 | Y |
| 13 | | 16.05 | 15.60 | N | 7.70 | 0.00 | Y |
| 14 | | 15.60 | 15.05 | N | 7.95 | 0.00 | Y |
| 15 | | 15.70 | 15.55 | N | 8.35 | 7.70 | N |
| 16 | | 15.73 | 16.40 | N | 8.70 | 0.10 | Y |
| 17 | | 15.30 | 15.30 | N | 9.10 | 0.95 | Y |
| 18 | | 15.10 | 15.25 | N | 7.60 | 0.00 | Y |
| 19 | | 15.20 | 16.55 | N | 8.65 | 0.00 | Y |
| 20 | | 15.90 | 16.25 | N | 8.35 | 1.55 | N |
| 21 | | 16.30 | 15.65 | N | 7.80 | 0.45 | N |
| 22 | | 16.95 | 15.35 | N | 8.55 | 4.80 | N |
| 23 | | 16.55 | 15.10 | N | 7.45 | 2.15 | N |
| 24 | | 15.23 | 15.75 | N | 7.60 | 7.30 | N |
| 25 | | 15.90 | 15.25 | N | 7.70 | 0.00 | Y |
| 26 | | 15.50 | 15.25 | N | 9.15 | 0.00 | Y |
| 27 | | 15.10 | 16.35 | N | 8.35 | 0.00 | Y |
| 28 | | 15.30 | 17.10 | N | 7.60 | 0.00 | N |
| 29 | | 15.30 | 17.25 | N | 6.75 | 0.40 | N |
| 30 | | 15.75 | 15.00 | N | 7.75 | 0.85 | N |
| min | | 15.00 | 15.00 | | 7.45 | 0.00 | |
| max | | 17.40 | 17.25 | | 9.55 | 8.15 | |
| ave | | 15.73 | 15.70 | | 8.25 | 1.37 | |
| | FAILED: No Die to Substrate Adhesion observed on all different parameter combination | | PASSED | | | | FAILED |

| LEG | CONDITION | PARAMETER | | | DIE SHEAR (kgf, ave) | Die Drop / Peel-Off (YES/NO) |
|---|---|---|---|---|---|---|
| | | Bond Temp (°C) | Bond Time (sec) | Bond Force (kgf) | | |
| A | preHeat/preBake: OFF | 175 | 10 | 5 | 11.08 | 0/90 |
| B | | 175 | 5 | 5 | 10.13 | 0/90 |
| C | preHeat/preBake: ON | 175 | 10 | 5 | 7.93 | 0/90 |
| D | | 175 | 5 | 5 | 7.59 | 0/90 |
| E | preHeat/preBake: ON Laminator: ON | 175 | 10 | 5 | | 21/90 |
| F | | 175 | 5 | 5 | | 27/90 |

Figure 6

| Key Parameters | Setting | | | | | | |
|---|---|---|---|---|---|---|---|
| Bond Temp | 200°C | | | | 200°C | | |
| Bond Force | 10 kgf (maximum) | | | | 2 kgf | | |
| Bond Time | 10secs (maximum) | | | | 1sec | | |
| sample | Die Shear Response 2.5kgf min | | Die Crack (Y/N) | | Die Shear Response 2.5kgf min | | Die Crack (Y/N) |
| | at Time 0 | After 24hrs Staging | | | at Time 0 | After 24hrs Staging | |
| 1 | 16.30 | 15.30 | N | | 9.55 | 8.75 | N |
| 2 | 15.45 | 15.90 | N | | 8.85 | 9.15 | N |
| 3 | 15.60 | 15.50 | N | | 7.75 | 7.65 | N |
| 4 | 15.50 | 15.15 | N | | 8.90 | 7.90 | N |
| 5 | 15.50 | 16.00 | N | | 8.45 | 8.15 | N |
| 6 | 15.65 | 15.15 | N | | 8.15 | 7.65 | N |
| 7 | 15.50 | 15.15 | N | | 7.60 | 7.75 | N |
| 8 | 15.20 | 15.90 | N | | 7.75 | 8.50 | N |
| 9 | 16.90 | 17.10 | N | | 8.50 | 7.10 | N |
| 10 | 15.75 | 15.55 | N | | 7.70 | 7.85 | N |
| 11 | 15.00 | 15.10 | N | | 7.85 | 9.15 | N |
| 12 | 17.40 | 15.25 | N | | 9.10 | 8.70 | N |
| 13 | 16.05 | 15.60 | N | | 7.70 | 8.95 | N |
| 14 | 15.60 | 15.05 | N | | 7.95 | 7.35 | N |
| 15 | 15.70 | 15.55 | N | | 8.35 | 7.70 | N |
| 16 | 15.70 | 16.40 | N | | 8.70 | 8.10 | N |
| 17 | 15.30 | 15.30 | N | | 9.10 | 7.95 | N |
| 18 | 15.10 | 15.25 | N | | 7.60 | 8.35 | N |
| 19 | 15.20 | 16.55 | N | | 8.85 | 7.20 | N |
| 20 | 15.90 | 16.25 | N | | 8.35 | 7.55 | N |
| 21 | 16.30 | 15.65 | N | | 7.80 | 7.45 | N |
| 22 | 16.95 | 15.35 | N | | 6.55 | 8.80 | N |
| 23 | 16.55 | 15.10 | N | | 7.45 | 9.15 | N |
| 24 | 15.00 | 15.75 | N | | 7.60 | 9.30 | N |
| 25 | 15.90 | 15.25 | N | | 7.70 | 8.55 | N |
| 26 | 15.50 | 15.25 | N | | 9.15 | 7.60 | N |
| 27 | 15.10 | 16.35 | N | | 8.35 | 8.35 | N |
| 28 | 15.25 | 17.10 | N | | 7.60 | 8.00 | N |
| 29 | 15.30 | 17.25 | N | | 8.75 | 9.40 | N |
| 30 | 15.75 | 15.00 | N | | 7.75 | 8.85 | N |
| min | 15.00 | 15.00 | | | 7.45 | 7.10 | |
| max | 17.40 | 17.25 | | | 9.55 | 9.40 | |
| ave | 15.73 | 15.70 | | | 8.25 | 8.23 | |

Figure 7

SEMICONDUCTOR PACKAGE AND METHOD OF ATTACHING SEMICONDUCTOR DIES TO SUBSTRATES

CROSS-REFERENCE TO RELATED APPLICATIONS

This application is a divisional application of U.S. patent application Ser. No. 12/344,023, filed Dec. 24, 2008 now abandoned, which claims priority from U.S. Provisional Application No. 61/016,863, filed Dec. 27, 2007, the contents of which are incorporated herein by reference in their entirety.

BACKGROUND OF INVENTION

1. Field of Invention

Apparatuses consistent with the present invention relate to semiconductor packages and methods for manufacturing semiconductor packages. More particularly, the present invention relates to a semiconductor package wherein a solder mask adheres a semiconductor die to the substrate through the application of heat and pressure.

2. Description of the Related Art

Current methods for manufacturing semiconductor packages, such as lead-on-chip (LOC) devices, include applying a printable paste, epoxy or tape onto a substrate and then pressing the semiconductor die onto the paste. Next, curing is performed (not if tape is used), which securely bonds the die to the substrate. The curing step can take up to three hours.

However, because the manufacture of semiconductor packages is a high volume process, designers are always looking for ways to reduce cost and manufacturing time. One cost savings approach that was investigated was to reduce the volume of paste used in the current process, such as a known as 4-dot printing design whereby four "dots" of adhesive are provided on the substrate for die attachment. However, this approach was unsuccessful because delamination of the die from the substrate occurred.

Therefore, an objective of the present invention is to develop a method of adhering a die to a substrate without the use of paste or adhesive tape. By eliminating the printable paste process, material and manpower savings can be obtained and manufacturing time can be shortened through the elimination of the LOC cure.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

An embodiment of the inventive method of mounting a semiconductor die on a substrate with a solder mask on a first surface includes placing a die on the solder mask, and mounting the die to the substrate by applying pressure and heat.

In another embodiment of the inventive method, the applied pressure ranges from a bond force of approximately 5 to 10 kgf.

In another embodiment of the inventive method, the heat has a temperature range from approximately 150 to 200° C.

In another embodiment of the inventive method, the pressure is applied for a range of approximately 1 to 10 seconds.

In another embodiment of the inventive method, the heat causes the solder mask to adhere said die to the substrate.

In another embodiment of the inventive method, the applied pressure is a bond force of approximately 5 kgf.

In another embodiment of the inventive method, the heat has a temperature of approximately 175° C.

In another embodiment of the inventive method, the pressure is applied for approximately 5 seconds.

In another embodiment of the inventive method, the solder mask is not pre-baked before the die is attached.

An embodiment of the inventive semiconductor package includes a semiconductor die, a substrate, and a solder mask, wherein the solder mask adheres the die to the substrate.

In another embodiment of the inventive package, the substrate also includes a core and a metal layer wherein the metal layer is between the core and the solder mask.

In another embodiment of the inventive package, the solder mask is made of acrylic epoxy.

In another embodiment of the inventive package, the solder mask has a thickness of approximately at least 30 μm.

BRIEF DESCRIPTION OF THE DRAWINGS

The above and/or other aspects of the present invention will become apparent and more readily appreciated from the following description of the exemplary embodiments, taken in conjunction with the accompanying drawings, in which:

FIG. 2 is a table of technical specifications of an exemplary substrate.

FIGS. 4A, 4B, 5, 6 and 7 are tables showing results of different studies related to the inventive method.

DETAILED DESCRIPTION OF EXEMPLARY EMBODIMENTS OF THE INVENTION

Hereinafter, exemplary embodiments of the present invention will be described with reference to the accompanying drawings.

Prior to arriving at the present invention, a baseline study was performed to aid in the determination of the optimum parameters and methods. The study involved attempting to mount a plurality of dies to a bare substrate. After the dies were placed on the substrate, various pressures in the form of bonding forces (1 kgf to 10 kgf) and heat were applied. The temperatures ranged from 100° C. to 475° C. After application of the various pressures and heat, none of the dies adhered to the substrate. In addition, the substrate began showing signs of burning at temperatures above 300° C. Burning was very apparent at temperatures at and above of 350° C. Also, the passivation coating of the die surface was damaged during the process.

Figure 1:
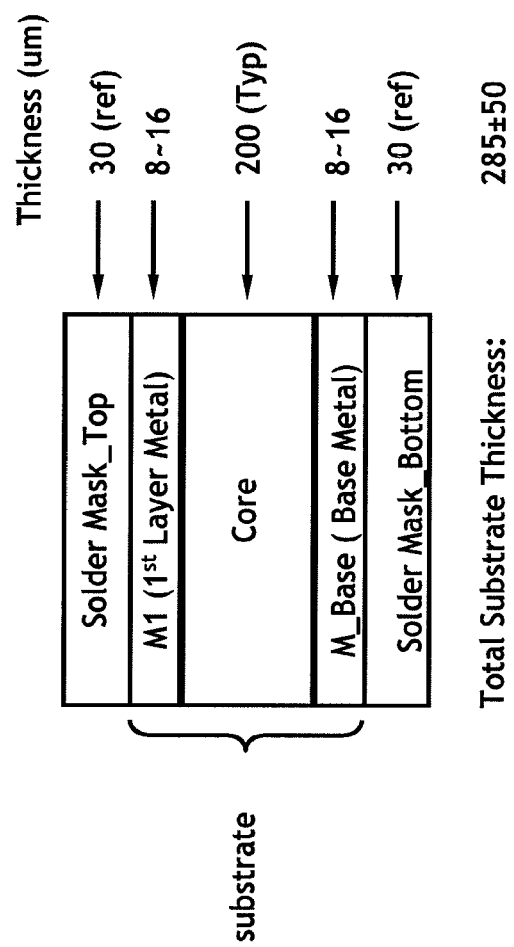
FIG. 1 is a cross-sectional view of an embodiment of the inventive substrate with solder masks.

Next, studies were performed to see if a solder mask could be used to adhere the die to the substrate. The studies used a two-metal layer substrate composition supplied by Kinsus that had a solder mask applied over the bare metal layers. The invention is not limited to substrates supplied by Kinsus. In this particular embodiment, the solder mask was made from acrylic epoxy. FIG. 1 shows a substrate with top and bottom solder masks applied on the metal layers M1 and M_Base. The metal layers cover a substrate core. Technical specifications of an exemplary substrate are shown in FIG. 2. The solder mask may be applied to the metal layers by well-known printing methods. In addition, the solder mask is formed at least on areas between the die and the substrate.

In the particular embodiment shown in FIG. 1, the core is approximately 200 μm thick, the metal layers are approximately 8-16 μm thick, and the solder masks are approximately 30 μm thick. The total substrate thickness, with the solder masks is approximately 285±50 μm. Solder masks that are greater than 30 μm thick will also be acceptable for this invention.

Figure 3:
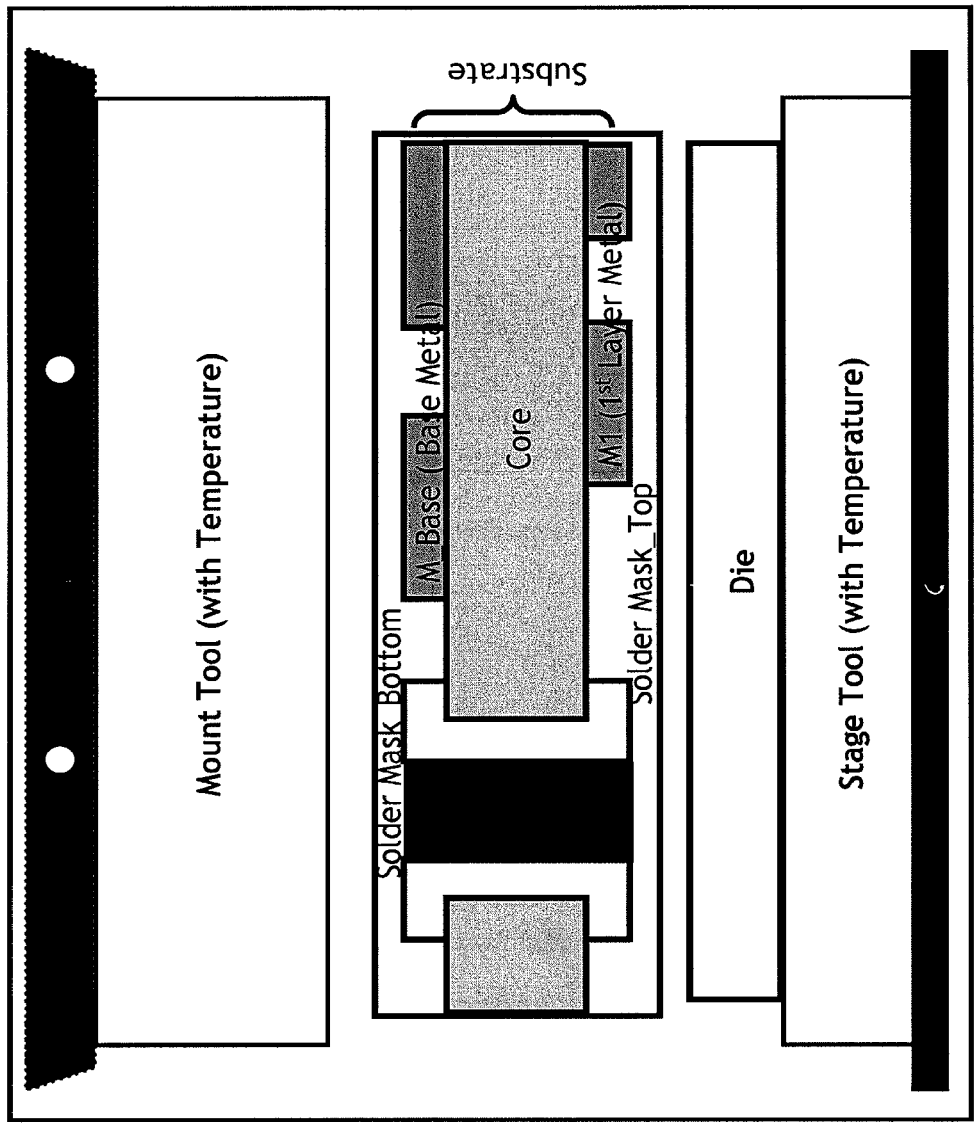
FIG. 3 is a cross-sectional view of an exemplary mounting device.

FIG. 3 is a representation of a mounting device that can used to mount the die to the substrate, with the solder masks already applied. In the study, a Renesas CM 700 series lead-on-chip mounter was used along with diamond coated 8.0× 8.0 mm mount and stage tools. The invention is not limited to mounting machines supplied by Renesas. The die is positioned next to the corresponding substrate by the stage tool. After the stage tool and mount tool are heated, the mount tool presses the die and substrate together. The heat causes the material state of the solder mask to change, which causes the die to adhere to the substrate.

During the study, several combinations of temperature (e.g., 150, 175 and 200° C), bond force (e.g., 1, 2, 5 and 10 kgf) and bond time (e.g., 1,5 and 10 sec.) were used. FIG. 4A and 4B shows some of the different combinations and results. In the first six legs in FIG. 4A, none of the dies adhered to the substrate. Likewise, in the first leg in FIG. 4B, the die did not adhere.

In legs 7A and 7B in FIG. 4A, some dies adhered, however, approximately one-third of the dies did not adhere.

In legs 8A and 8B in FIG. 4A, all dies adhered satisfactorily. The parameters that were used in stages 8A and 8B were a temperature of 200° C., pressure of 10 kgf and a bond time of 10 seconds.

In legs 2 through 9 in FIG. 4B, the dies adhered satisfactorily, despite issues with low die shear, high bond forces and high temperatures. The optimal combination of parameters occurred in leg 5. In that leg, the temperature was 175° C., bond force was 5 kgf and bond time of 5 seconds.

Next, studies were performed to see if oven baking impacted the process. Studies were carried out using substrates with solder masks that were not pre-baked, and substrates with solder masks that were pre-baked. As shown in FIG. 5, when the substrates that were not oven baked before die attachment, all of the samples had acceptable results. However, when the substrates were oven baked before die attachment, many of the samples failed. Hence, the studies show that it is desirable to use substrates with solder masks that are not pre-baked before assembly.

FIG. 6 is a summary of studies that were performed with different conditions on the mounting device. As mentioned above, the mounting device used in these series of studies is Renesas CM 700 series lead-on-chip mounter together with diamond coated 8.0×8.0 mm mount and stage tools. The mounting device has "pre-heat", "pre-bake" or "laminate" functions typically designed for die attachment to substrates using adhesive paste or tape. For example, the "pre-heat" function heats up the adhesive before die attachment, the "pre-bake" function bakes the adhesive to remove moisture before die attachment and the "laminator" function laminates the adhesive (in the form of tape) onto the substrate before die attachment. As the present invention does not utilize any form of adhesive between the die and substrate, the inventors have experimented with these functions for die attachment to the solder mask layer of the substrate. The mounting device was configured as follows—Legs A & B with pre-heat, pre-bake and laminator functions OFF, Legs C & D with pre-heat and pre-bake functions ON and laminator function OFF, and Legs E & F with pre-heat, pre-bake and laminator functions ON. It was found that die adhesion is most satisfactory in Legs A & B when the pre-bake, pre-heat and laminator functions are OFF. Die adhesion was also observed for Legs C & D but with lower die shear values. Some of the dies did not adhere in Legs E & F thereby showing that conditions of pre-heat, pre-bake and laminator functions in togetherness are not desirable.

FIG. 7 shows additional test results.

In summary, the studies showed that good die to substrate adhesion is possible when using the following parameter settings: Bond Force of 5-10 kgf; Bond Time of 1-10 seconds; Bond Temperature of 150-200° C. Optimal parameter settings would be Bond Force of 5 kgf; Bond Time of 5 seconds; Bond Temperature of 175° C. The studies also show that substrates with solder mask which are not pre-baked are desirable in this invention.

These parameter settings have been shown to provide good die to substrate adhesion even after MSL 3 testing. In addition, no die cracks were observed during the mounting process. Advantageously, the present invention provided means of attaching a die to a substrate without using an adhesive paste or tape thereby resulting in process time, material and manpower savings While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of mounting a semiconductor die on a substrate comprising:
    providing a substrate having a substrate core and a solder mask disposed over a first surface of the substrate core;
    placing a die on said solder mask;
    mounting said die to said substrate by applying pressure and heat, wherein the heat causes the material state of the solder mask to change, which causes the die to adhere to the substrate.

2. The method of claim 1 wherein said applied pressure ranges from a bond force of approximately 5 to 10 kgf.

3. The method of any one of claims 1 and 2 wherein said heat has a temperature range from approximately 150 to 200° C.

4. The method of any one of claims 1 and 2 wherein said pressure is applied for a range of approximately 1 to 10 seconds.

5. The method of claim 1 wherein said applied pressure is a bond force of approximately 5 kgf.

6. The method of any one of claims 1 and 5 wherein said heat has a temperature of approximately 175° C.

7. The method of any one of claims 1 and 5 wherein said pressure is applied for approximately 5 seconds.

8. The method of claim 1 wherein said solder mask is not pre-baked before said die is attached.

9. A method for forming a semiconductor package comprising:
    providing a substrate having a substrate core and a non-prebaked solder mask disposed on a first surface of the substrate core;
    placing a die on the non-prebaked solder mask; and
    mounting the die to the substrate by applying pressure and heat, wherein the heat causes the material state of the non-prebaked solder mask to change, which causes the die to adhere to the substrate.

10. The method of claim 9 wherein the applied pressure ranges from a bond force of approximately 5 to 10 kgf.

11. The method of claim 10 wherein the applied pressure is a bond force of approximately 5 kgf.

12. The method of claim 9 wherein the heat has a temperature range from approximately 150 to 200° C.

13. The method of claim 12 wherein the heat has a temperature of approximately 175° C.

14. The method of claim 9 wherein the pressure is applied for a range of approximately 1 to 10 seconds.

15. The method of claim 14 wherein the pressure is applied for approximate 5 seconds.

16. The method of claim 9 wherein the solder mask comprises acrylic epoxy.

17. The method of claim 9 wherein the solder mask has a thickness of approximately at least 30 μm.

18. The method of claim 9 wherein the substrate includes a metal layer, the metal layer is between the substrate core and the solder mask.

19. The method of claim 9 wherein the substrate further includes a non-prebaked solder mask on a second surface of the substrate.

20. The method of claim 8 wherein die adhesion using the non-prebaked solder mask before said die is attached comprises a higher die shear value relative to die adhesion using a pre-baked solder mask.

* * * * *